United States Patent [19]

Woodbury et al.

[11] Patent Number: 4,989,226

[45] Date of Patent: Jan. 29, 1991

[54] LAYERED DEVICES HAVING SURFACE CURVATURE

[75] Inventors: Richard C. Woodbury; Raymond R. Perkins; James M. Thorne; Larry V. Knight, all of Provo, Utah

[73] Assignee: Brigham Young University, Provo, Utah

[21] Appl. No.: 425,286

[22] Filed: Oct. 23, 1989

Related U.S. Application Data

[62] Division of Ser. No. 87,778, Aug. 21, 1987.

[51] Int. Cl.$^5$ .................... G21K 1/00; G01N 21/23; G02B 5/10; G02B 5/126

[52] U.S. Cl. .................... 378/145; 378/70; 378/84; 350/607; 350/629; 350/630

[58] Field of Search .................... 378/70, 84, 145, 85; 350/607, 629, 630

[56] References Cited

U.S. PATENT DOCUMENTS 4,420,222 12/1983 Bret et al. .................... 350/630
4,451,119 5/1984 Meyers et al. .................... 350/607
4,461,018 7/1984 Ice et al. .................... 378/84
4,487,196 12/1984 Murphy .................... 350/607
4,525,853 6/1985 Keem et al. .................... 378/84
4,885,055 12/1989 Woodbury et al. .................... 156/647

OTHER PUBLICATIONS

"Plated Copper Substrates . . . ", by Blevins et al., SPIE, vol. 171, Optical Components: Manufacture & Evaluation (1979), 125–130.

*Primary Examiner*—Janice A. Howell
*Assistant Examiner*—Don Wong
*Attorney, Agent, or Firm*—Thorpe, North & Western

[57] ABSTRACT

A method of treating a substrate having first and second sides with corresponding oppositely facing first and second surfaces, to produce curvature in the first surface. The method includes the steps of removing material, according to a predetermined pattern, from the second side of the substrate, and applying a stress-producing film of material to at least one surface of the substrate to thereby cause the substrate to bend to produce the desired curvature in the first surface.

5 Claims, 1 Drawing Sheet

15
5
2
12
11
3
1
7
14
13
4

LAYERED DEVICES HAVING SURFACE CURVATURE

This is a division of application Ser. No. 07/087,778, filed Aug. 21, 1987.

BACKGROUND OF THE INVENTION

This invention relates to a method of producing curvature on the surface of a substrate through selective removal of material from the substrate and selective application of stress-producing materials to the substrate.

The use of lenses and mirrors to focus and direct visible light and other electromagnetic radiation is well established. Conventional lenses and mirrors, however, are not effective for focusing or directing electromagnetic radiation having short wavelengths, such as x-rays and short-wave ultraviolet rays. It is known that short wavelength radiation is strongly reflected from reflective surfaces if the angle of incidence to the surfaces is low, for example, less than five degrees for one nanometer (nm) or shorter wavelength x-rays. Employing such so-called grazing incidence techniques, however, is only effective if suitably uniform and smooth reflective surfaces can be found, and this has proved difficult to do. Use of conventional polished or mirrored surfaces, prepared using known grinding and polishing techniques, generally does not provide the desired control and accuracy in reflecting short wave radiation.

One approach to achieving better control and accuracy in reflecting x-rays, even at larger angles of incidence, is to use so-called Bragg reflection—reflection of radiation from planes of a crystal. The drawback of this has, until recently, been that only very short wavelength x-rays (less than one nanometer) could be reflected. Recently, however, multi-layered thin film structures have been employed for reflecting longer wavelength x-rays.

Such reflection occurs at the interfaces of adjacent films having different refractive indices. The layers can be selected so that reflected waves add constructively to produce a strong total reflection.

In order to focus electromagnetic radiation using reflection, it is necessary to provide an appropriate curved surface capable of reflecting the radiation. Currently used focusing devices are constructed either by lathing, grinding or otherwise abraiding a surface of a reflector element into a curved surface, or by casting a reflector element on a curved mandrel. Among the problems with these approaches are the difficulty of obtaining desired curvatures, the roughness of the resulting curved surface, and the time required to prepare the elements. Polishing, of course, would be performed to smooth out the surface, but remaining irregularities would preclude or discourage use of the surface for focusing shorter wave radiation such as x-rays.

SUMMARY OF THE INVENTION

It is an object of the invention to provide a method of producing a smooth curved surface of a desired shape suitable for, but not limited to, use as an optical focusing blank for short wavelengths such as x-rays.

It is also an object of the invention to provide such a method which is relatively easy and inexpensive to carry out.

It is a further object of the invention to provide such a method wherein the degree of curvature can be precisely controlled.

It is another object of the invention to provide a precision focusing structure for radiant energy.

The above and other objects are realized in a specific illustrative embodiment of a method of producing curvature on a working surface of a substrate. The substrate, which may be a crystalline or amorphous material, has a working side and surface, and a second side and oppositely facing surface from which substrate material is removed according to a predetermined pattern. The removal of material may be carried out by etching or even by cutting or abraiding with a cutting or abrasive tool. A stress producing film is applied to at least one of the surfaces to cause the substrate to bend and produce the desired curvature in the working surface. The amount and shape of the curvature is determined by the substrate thickness at the bottom of the removed material pattern, the shape of the areas from which material is removed, and the stresses (dependent in part on the thickness) of the film. The film may be selected to produce tensile stress or compressive stress on the substrate, and placed on either or both sides of the substrate to cause the desired bending.

Although the above discussion concerned the use of the curved surface for focusing electromagnetic waves, the curved surface structure might also be used as molds for machinery, tools, etc., as specially shaped support structure for electrical circuitry, as electromagnetic radiation detectors, or as diffraction gratings.

BRIEF DESCRIPTION OF THE DRAWINGS

The above and other objects, features and advantages of the invention will become apparent from a consideration of the following detailed description presented in connection with the accompanying drawings in which.

DETAILED DESCRIPTION

Figure 1:
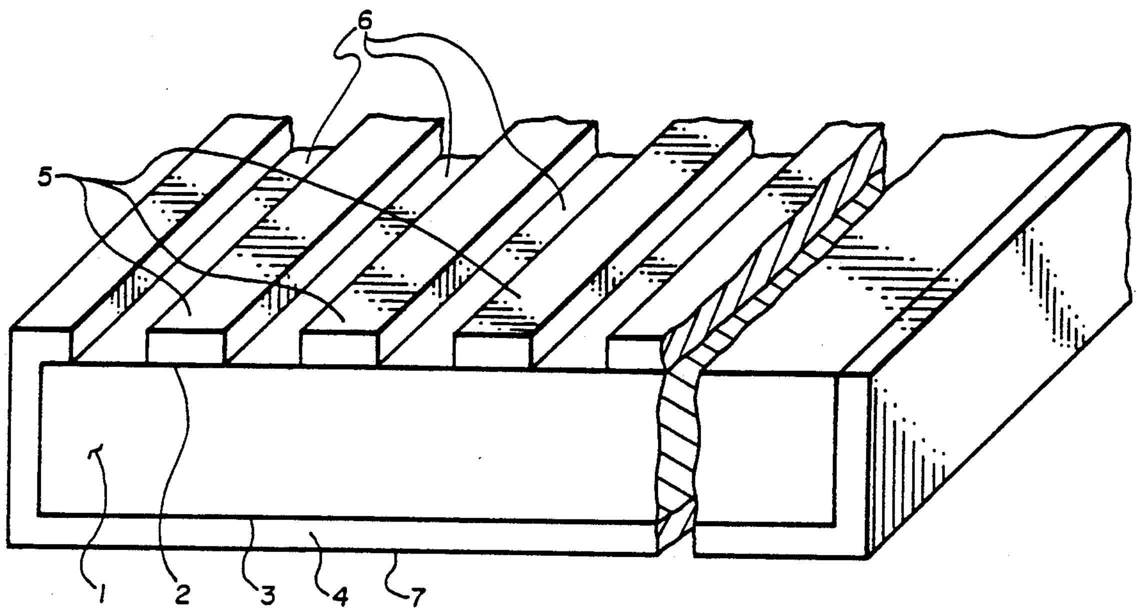
FIG. 1 is an isometric view of a substrate partially prepared, in accordance with the principles of the present invention, for etching a pattern of grooves in one surface to produce a desired curvature in an opposite surface.

Referring to FIG. 1, there is shown a single-crystal silicon substrate or wafer 1 having highly polished, oppositely facing surfaces 2 and 3. The silicon substrate 1 is initially prepared so that the surfaces 2 and 3 are generally parallel with the so-called [110] crystal planes of the substrate. Such substrates are commercially available and are known as [110] silicon wafers. Although the substrate is shown as being generally rectangular, for the method of forming curved surfaces to be described herein, other shapes such as circular, oval or the like could also be selected, depending upon the needs and interests of the user. Advantageously, thickness variation in the substrate 1 will be less than five micrometers (microns) over a two centimeter surface distance.

Shown covering the bottom surface 3, sides, and part of the top surface 2 is a layer of silicon nitride 4. Ridges 5 of silicon nitride are formed on the top surface 2 of the substrate using known film etching techniques. For example, the substrate 1 would typically be first thoroughly cleaned such as in a bath of a solution of sulfuric acid and hydrogen peroxide. After rinsing with water, the substrate is placed in a 900° C. oven so that a layer of silicon dioxide may be dry-grown on the substrate surfaces to a thickness of between five and twenty nm. This oxide layer serves as a stress buffer for the substrate to prevent cracking thereof when later subjected to silicon nitride deposition.

Following growth of the silicon dioxide layer (not specifically shown in FIG. 1), the substrate is covered with a silicon nitride layer 4 which will serve several purposes including development of a stress to bend the substrate, acting as a mask to enable selective etching of the substrate, and protecting the side 3 of the substrate opposite the side to be etched. The nitride layer 4 may be deposited at a temperature between 800° and 900° C., using well known low pressure chemical vapor deposition (LPCVD) techniques, to a thickness of about 0.24 microns. The deposited nitride layer develops a tensile stress as will be discussed further later on. It should be understood that the parameters for deposition of the nitride layer could also be successfully employed.

Over the nitride layer 4 on one side of the substrate, a photoresist layer is deposited such as by spinning. A mask, containing the pattern to be etched into the substrate 1, is then used to expose the pattern in the photoresist layer. The etching pattern to be used consists of a series of side-by-side, generally parallel grooves, which will facilitate bending the substrate to produce the desired curvature. The width and spacing of the grooves, as well as the ultimate depth, all contribute to determining the amount of bending which will be produced in the substrate.

To facilitate the etching of grooves in the silicon crystal substrate 1 in the desired shape (generally parallel side walls), it is advantageous to align those portions of the mask corresponding to the grooves with the lines of intersection between the [111] planes of the substrate crystal perpendicular to the surface and the surface plane, (corresponding to a <110> plane) of the substrate (these imaginary lines of intersection in the substrate surface are called traces). The etching process will occur much faster in the <110> crystal direction than in the <111> direction to thus allow for development of grooves in the substrate having generally parallel sidewalls.

After exposure of the mask pattern in the photoresist layer, the photoresist is developed to remove it from those areas where the grooves are to be produced. These areas leave areas of silicon nitride exposed for subsequent removal. Before removal of the exposed nitride areas, a protective layer of photoresist is applied over the nitride layer on the other side of the substrate.

The exposed silicon nitride areas are then removed, for example, by use of a conventional plasma chamber. To completely remove the exposed nitride and also the underlying silicon dioxide, the substrate is placed in a standard solution of buffered hydrofluoric acid. A stripping solution may then be used to remove all remaining photoresist material. The condition of the substrate after completing these steps is as shown in FIG. 1, and the substrate is now in a condition where deep grooves may be etched in the substrate itself.

Etching of grooves in the silicon crystal substrate is carried out by placing the substrate in a 44% weight/weight solution of potassium hydroxide and water mixed in a 5:2 ratio. This solution serves to etch approximately six hundred times faster in the <110> direction than in the <111> direction and the result is the formation of grooves having substantially vertical side walls (ribs). The etching process continues until the desired thickness 11 (FIG. 2) of the silicon substrate at the bottom of the grooves is achieved.

Figure 2:
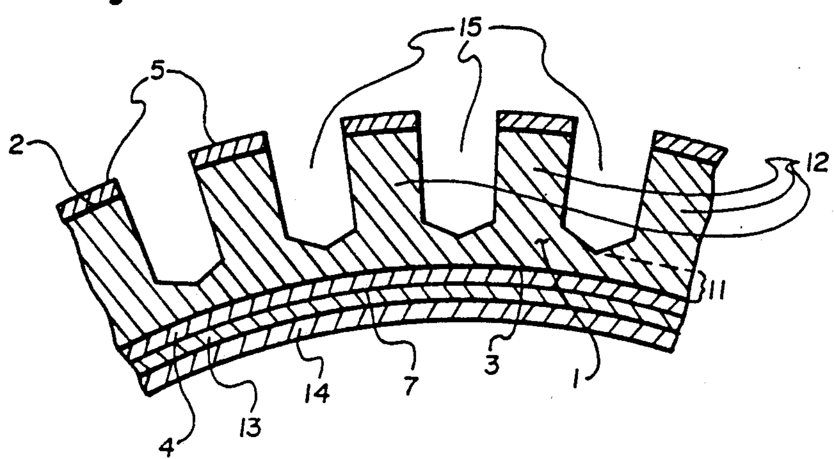
FIG. 2 is a sectional, partially fragmented view of the substrate of FIG. 1 after etching and bending.

Since the silicon nitride layer 4 on the bottom of the substrate 1 develops a tensile stress with respect to the substrate, the substrate slowly bends as the groove etching process takes place, as shown in FIG. 2, to produce a generally concave curvature on the bottom surface. As earlier indicated, the degree or radius of curvature of the substrate is dependent upon a number of factors such as groove depth and width, rib thickness, substrate thickness 11, and thickness of and stress produced by the silicon nitride layer 4. The inter-relationship and effect of these factors on curvature are known, see Woodbury, R. C. et al, "Curved Silicon Substrates for Multilayer Structures", SPIE Vol. 691 X-Ray Imaging II (1986).

To mechanically strengthen the substrate of FIG. 2, a backing or potting material may be placed between ribs 12 developed by etching the grooves. Such potting material may be a conventional polymeric (e.g. epoxy) adhesive which upon hardening would strengthen the substrate and maintain the curved surface (or interface) 3 in the desired shape. It might be noted that by strengthening the substrate in the manner described, further bending of the substrate may be induced, and this should be taken into account when doing the initial bending.

If the resulting substrate structure of FIG. 2 is to be used for focusing visible light, the functional surface 7 of the silicon nitride layer 4 would be covered with a reflective thin film coating 13, such as aluminum, gold, or a dielectric coating. If it were to be used to focus x-rays, a periodic-multilayer coating 14 would be applied to the concave side of the substrate. Use of the substrate structure as a Bragg angle diffractor would not require a special additional coating, but would require bending of the structure to produce a surface curvature which would accommodate Bragg angle diffraction requirements.

The above-described method and process for producing a curved (cylindrical) surface on a substrate is one of a number of processes which might be used. Another embodiment of the method of the present invention suitable for achieving non-cylindrical bending (i.e., bending about more than one axis) could include the steps described above up to the bending of the substrate and before application of additional films, such as reflective coatings, to the concave surface. At this point, the substrate could next be subjected to high pressure, low temperature oxidation of the exposed portions of silicon for the purpose of achieving oxide growth. Producing oxide growth at lower temperatures reduces susceptability to slip of substrate crystal planes. High pressure, of about 10 atmospheres to 100 atmospheres, is used so that oxidation of the silicon can proceed rapidly enough to cause the formation of a silicon dioxide layer on the sides of the ribs 12 (FIG. 2) and at the bottoms of the grooves 15, all at lower temperatures, e.g., below 700° C.

Since silicon dioxide when applied to a silicon substrate produces compressive stresses, the silicon dioxide layers produced as discussed above operate to produce compressive stresses parallel to the ribs 12 and this causes the substrate to bend, with an arc of curvature in the plane of the ribs (rather than in the plane of curvature shown in FIG. 2). The result is a noncylindrical bending, i.e., a bending about more than one axis.

After development of a silicon dioxide layer, other coatings such as reflective coatings could be added to the working surface.

Still another embodiment of the method of the present invention involves substantially the same steps described in the first embodiment except that the initial silicon dioxide film is ultimately used to produce the etching pattern in the substrate and is thermally grown on the substrate to a thickness of between 0.7 and 2 microns. Such thermal-growth techniques are well known in the art. After growth of the silicon dioxide layer, the mask pattern is produced directly in the silicon dioxide layer, without the use of silicon nitride. Grooves in the silicon are then etched in a standard fashion. After etching, a silicon dioxide layer is thermally grown on all exposed surfaces of the substrate and then silicon dioxide is removed from the working or functional surface to allow the compressive stresses produced by the silicon dioxide on the etched side to bend the substrate, thereby yielding the desired concave curvature on the working side.

It is to be understood that the above-described arrangements are only illustrative of the application of the principles of the present invention. Numerous modifications and alternative arrangements may be devised by those skilled in the art without departing from the spirit and scope of the present invention and the appended claims are intended to cover such modifications and arrangements.

What is claimed is:

1. A device for directing electromagnetic radiation comprising a substrate having first and second sides and corresponding oppositely facing first and second surfaces, said substrate further having a predetermined pattern of areas on said second side from which substrate material has been removed, and a stress-producing film of material coated on at least one of the surfaces of the substrate, wherein said film in combination with said areas on said second side from which substrate material has been removed, bends said substrate to a desired curvature so that said first surface reflects electromagnetic radiation.

2. The device of claim 1 further including a coating of reflective material overlying said first surface.

3. The device of claim 1 further including a plurality of layers of x-ray radiation reflective films.

4. The device of claim 1 wherein said first surface is polished to reflect electromagnetic radiation.

5. The device of claim 1 wherein the second side of the substrate is formed with a series of alternating grooves and ribs arranged generally parallel to one another.

* * * * *